United States Patent
Wen et al.

(10) Patent No.: US 8,742,555 B2
(45) Date of Patent: Jun. 3, 2014

(54) LEAD FRAME HAVING A FLAG WITH IN-PLANE AND OUT-OF-PLANE MOLD LOCKING FEATURES

(76) Inventors: Jian Wen, Chandler, AZ (US); Darrel R. Frear, Phoenix, AZ (US); William G. McDonald, Payson, AZ (US)

( * ) Notice: Subject to any disclaimer, the term of this patent is extended or adjusted under 35 U.S.C. 154(b) by 104 days.

(21) Appl. No.: 13/220,898

(22) Filed: Aug. 30, 2011

(65) Prior Publication Data

US 2013/0049181 A1 Feb. 28, 2013

(51) Int. Cl.
*H01L 23/62* (2006.01)
*H01L 23/495* (2006.01)

(52) U.S. Cl.
CPC .... *H01L 23/49503* (2013.01); *H01L 23/49544* (2013.01); *H01L 23/49548* (2013.01); *H01L 23/49551* (2013.01); *H01L 23/49555* (2013.01); *H01L 2224/32245* (2013.01); *H01L 2224/48247* (2013.01); *H01L 2224/73265* (2013.01); *H01L 2924/00* (2013.01)
USPC .... 257/676; 257/666; 257/670; 257/E23.052; 257/E23.066; 257/E21.502; 438/110; 438/111; 438/122; 438/123; 438/124

(58) Field of Classification Search
CPC .............. H01L 23/49503; H01L 23/49544; H01L 23/49562; H01L 23/49548; H01L 23/49551; H01L 23/49555; H01L 2224/32245; H01L 2224/48247; H01L 2224/73265; H01L 2924/00
See application file for complete search history.

(56) References Cited

U.S. PATENT DOCUMENTS

| | | | |
|---|---|---|---|
| 5,041,902 A | 8/1991 | McShane | |
| 5,278,446 A * | 1/1994 | Nagaraj et al. ................ | 257/707 |
| 5,358,905 A | 10/1994 | Chiu | |
| 6,246,111 B1 * | 6/2001 | Huang et al. .................. | 257/675 |
| 6,501,158 B1 | 12/2002 | Fazelpour et al. | |
| 7,489,026 B2 | 2/2009 | Wang et al. | |
| 7,741,704 B2 | 6/2010 | Lange et al. | |
| 7,834,431 B2 | 11/2010 | Hooper et al. | |
| 2009/0321913 A1 | 12/2009 | Shim et al. | |

* cited by examiner

*Primary Examiner* — Yasser A Abdelaziez
(74) *Attorney, Agent, or Firm* — Jonathan N. Geld

(57) ABSTRACT

A semiconductor device lead frame having enhanced mold locking features is provided. The lead frame has a flag with bendable edge features along the edge of the flag. Each edge feature is shaped to resist movement against encapsulating mold material in a plane of the edge feature. By bending a portion of the edge feature, improved mold locking of the flag is provided in multiple planes.

15 Claims, 3 Drawing Sheets

LEAD FRAME HAVING A FLAG WITH IN-PLANE AND OUT-OF-PLANE MOLD LOCKING FEATURES

BACKGROUND

1. Field

This disclosure relates generally to lead frames for packaged electronic devices, and more specifically, to a lead frame with a flag having in-plane and out-of-plane encapsulant mold compound locking capability.

2. Related Art

Electronic devices such as integrated circuits and systems on a chip can be implemented in packaged electronic devices. The elements of a packaged electronic device generally include one or more metal lead frames, one or more integrated circuit die, bonding material to attach the integrated circuit die to a flag (or die pad) of the lead frame, bonding wires which electrically connect pads on the die to individual leads of the lead frame, and a hard plastic packaging material, or encapsulant, which covers the other components and forms the exterior of the packaged electronic device. The packaging material, or encapsulant, provides protection from hostile environments and can provide structural support for electrical interconnections from the die.

The lead frame is the central supporting structure of such a package. A portion of the lead frame is internal to the package and completely surrounded by the packaging material. Portions of the leads of the lead frame may extend externally from the package and can be used to connect the package externally. A quad flat no leads (QFN) package is an example of an integrated circuit package usable with surface mounted printed circuit boards. In this type of integrated circuit package, the leads do not extend externally from the package. Rather, lead contacts of the lead frame are exposed on the bottom surface of the package for connection to the outside complements. As such, the lead frame used in a QFN integrated circuit device is sometimes referred to as a leadless lead frame.

One potential drawback of some packaged devices is that certain environmental stresses can cause separation, or delamination, of portions of the lead frame (e.g., the flag) from the packaging material. For example, reflow soldering is a common process for attaching surface mounted components such as a QFN packaged electronic device to a circuit board. During reflow soldering, the packaged electronic device can be subjected to elevated temperatures (e.g., 260° C.). Stress in the package due to differences in thermal expansion and other material properties of the dissimilar materials used in packaging under heat can result in separation. Temperature stresses can also be caused by normal operational variations in temperature. For example, packaged semiconductor devices used in automotive applications often experience operating environment temperatures from about 50° C. to about −40° C.

Different encapsulant mold compounds exhibit better performance characteristics for various operating environments (e.g., glass-like compounds), but some of those compounds may also exhibit greater risk of separation from encapsulated lead frames and devices. Since separation of a lead frame from the packaging material during manufacture or under operating conditions can adversely affect operation of the packaged electronic device, it is desirable to provide a lead frame having features that enhance locking of the lead frame with the molding material.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A lead frame having enhanced mold locking features is provided. Embodiments of the present invention provide a lead frame having a flag (e.g., mounting pad or die pad) with bendable edge features along the edge of the flag. Each edge feature is shaped to resist movement against encapsulating mold material in a plane of the edge feature. By bending a portion of the edge feature, improved mold locking of the flag is provided in multiple planes.

Figure 1:
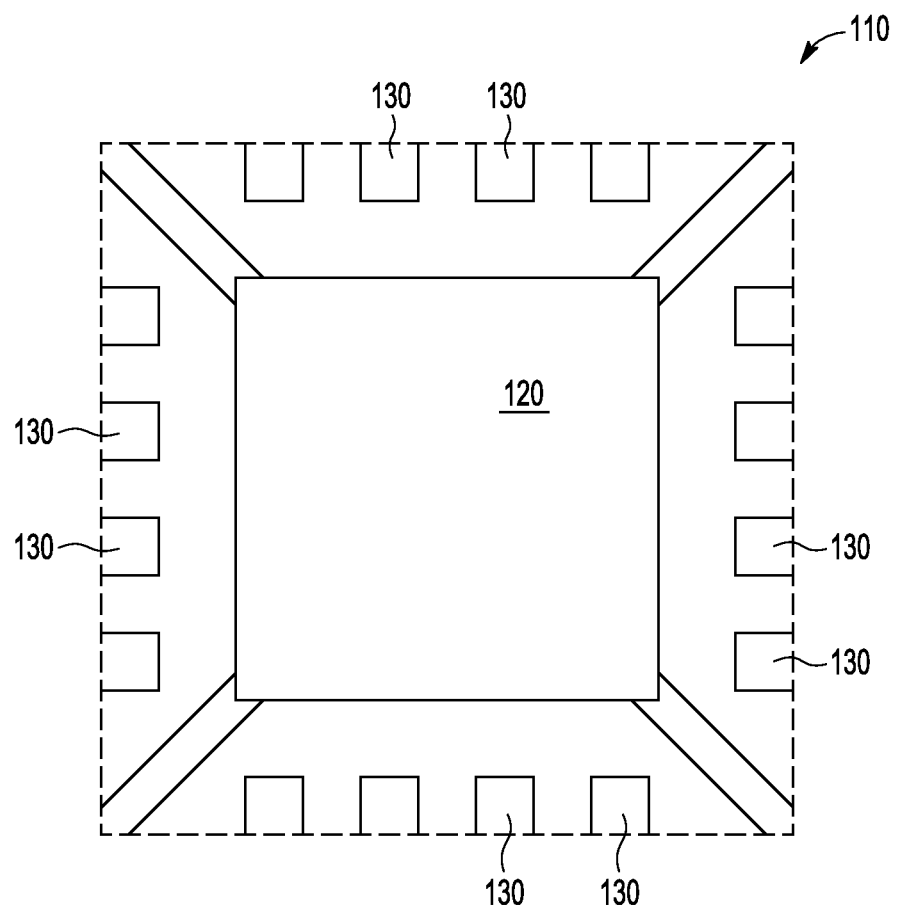
FIG. 1 is a simplified block diagram illustrating a top down view of a portion of a typical lead frame.

FIG. 1 is a simplified block diagram illustrating a top down view of a portion of a typical lead frame 110. A typical lead frame 110 includes a flag (e.g., mounting pad or die pad) 120 and leads 130. Flag 120 provides a mounting point for devices incorporated in the semiconductor package that includes the lead frame. Typical devices can include semiconductor die that are adhered to the flag using, for example, an epoxy compound. The structure for lead frame 110 illustrated in FIG. 1 is a portion of an overall lead frame that repeats the basic structure illustrated and which is incorporated into a panel during device manufacture. During a process of manufacturing the semiconductor package, the packages can be singulated along the dashed lines illustrated in FIG. 1.

Typical materials used to make a metallic lead frame include: copper and copper alloys; ferrous alloys containing nickel, cobalt or chromium; nickel and nickel alloys; and other metallic materials as appropriate to the application. Lead frames can be constructed from flat sheet-metal either by stamping or etching. Stamping is a mechanical process that employs die and punch sets to progressively achieve the intended lead frame structure through a series of stamping or punching steps. Etching involves selectively covering the sheet-metal with a photoresist according to a pattern of the lead frame. The sheet-metal can then be exposed to chemical etchants that remove areas not covered by photoresist. Either construction process can provide detailed lead frame features, as required by the application. Subsequent to stamping or etching, the lead frame can then be cleaned, silver plated (e.g., to improve wire bond and die attach quality), and otherwise prepared for inclusion in a package.

Figure 2:
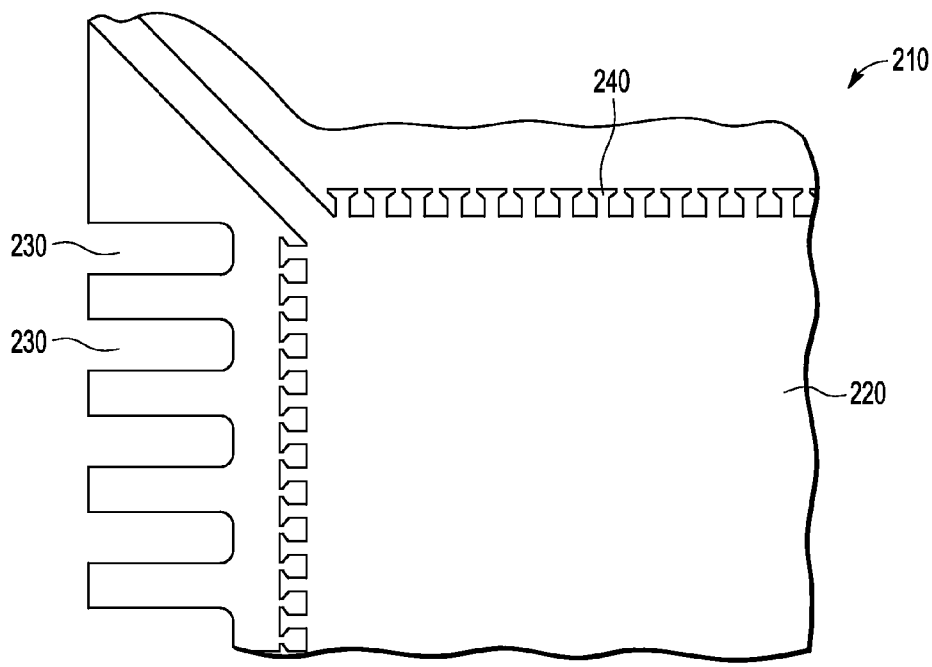
FIG. 2 is a simplified block diagram illustrating a top down view of a portion of a lead frame constructed in accord with embodiments of the present invention.

FIG. 2 is a simplified block diagram illustrating a top down view of a portion of a lead frame constructed in accord with embodiments of the present invention. Lead frame 210 includes a flag 220, leads 230, and flag edge features 240. Flag edge features 240 are arrayed along the periphery of flag 220 and are configured to be bent upward or downward at any angle to the plane of the flag, or can remain non-bent in the plane of the flag.

Flag edge features 240 are shaped in a manner that enhances locking of each flag edge feature with a molding compound used in the semiconductor package. As illustrated, the wider portion of a flag edge feature that is opposite the attachment point of the flag edge feature to the flag resists movement against a molding compound in the direction of a plane of the flag edge feature. Since delamination of the molding compound from the flag in a packaged device can occur in all directions, flag edge features 240 can be bent out of the plane of flag 220 to prevent delamination in direction other than the plane of the flag.

It should be understood that although FIGS. 1 and 2 illustrate a flag (120 and 220, respectively) in a rectangular shape, embodiments of the present invention are not limited to rectangular shapes, or to any particular shape. A shape of a flag will be determined in light of the application. Further, as will be discussed more fully below, embodiments of the present invention are not limited to the illustrated shape of the flag edge features, but are intended to employ those shapes most effective in locking with a particular mold compound.

Figure 3:
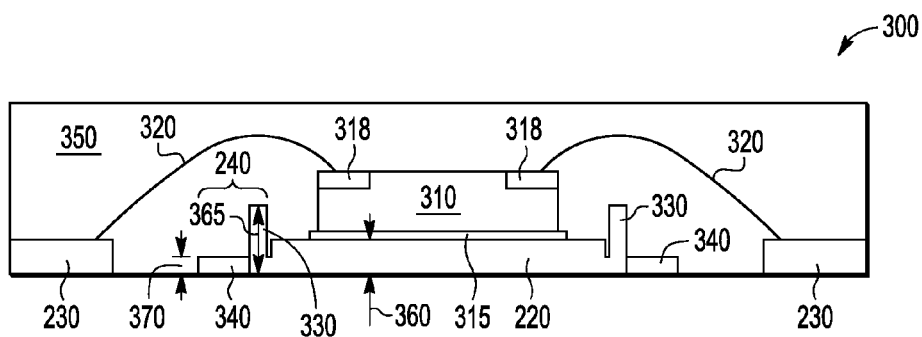
FIG. 3 is a simplified block diagram illustrating a cross-sectional side view of a packaged electronic device constructed in accord with an embodiment of the present invention.

FIG. 3 is a simplified block diagram illustrating a cross-sectional side view of a packaged electronic device 300 in accord with an embodiment of the present invention. Packaged electronic device 300 includes lead frame 210, illustrated as flag 220 and leads 230. Packaged electronic device 300 also includes die 310 attached to an upper surface of flag 220 by a layer of adhesive 315 (e.g., epoxy). Connection pads 318 on die 310 are connected to leads 230 by bonding wires 320. FIG. 3 further illustrates flag edge features 240 in a configuration in which there are bent up edge features 330 and non-bent edge features 340.

A molding compound 350 encapsulates all the structures of packaged electronic device 300, aside from exposed portions of flag 220 and leads 230 (e.g., in a QFN package). The molding compound can be any encapsulant appropriate to an application, including, for example, silica-filled epoxy molding compounds, plastic encapsulation resins, other polymeric materials such as phenolics and polyurethanes, and glass-like molding compounds such as liquid crystal polymers and thermoplastic materials. The molding compound can be applied by a variety of standard processing techniques used in encapsulation including, for example, printing, pressure molding, injection molding, transfer molding, and spin application. Once the molding compound is applied, a panel that includes lead frame 210 can be cured by exposing the materials to certain temperatures for a period of time, or by applying curing agents, or both.

In order to be effective at interlocking the flag with the mold compound, the flag edge features should be of a length that exposes the locking features of the free end of a flag edge feature in both bent and unbent configurations. Length of the flag edge features can be limited by the dimensions of the package in which the lead frame is incorporated as well as the space available to include the flag edge features between flag 220 and leads 230. In one embodiment of the present invention, flag edge features are of a length twice the thickness of the flag. As illustrated, flag 220 has a thickness 360, while bent up edge feature 330 has a length 365. In one embodiment of the present invention, edge feature length 365 is at least twice the dimension of flag thickness 360. Further, in order to facilitate bending, the thickness of the flag edge features is less than that of the flag itself. In one embodiment of the present invention, flag edge feature thickness 370 is approximately half that of flag thickness 360.

In one embodiment, the reduced thickness of the flag edge features over that of the flag is achieved by selectively etching the flag edge features. The shapes of the flag edge features and the entire lead frame are created using a photoresist process. Bending of the flag edge features to a desired angle is typically achieved using a mechanical bending process.

FIG. 3 illustrates a typical QFN package configuration utilizing embodiments of the present invention. Leads 230 are exposed to allow electrical connections with die 310 from sources external to packaged electronic device 300 (e.g., using solder reflow on a printed circuit board). In addition, a surface of flag 220 opposite that of attached die 310 is also exposed to permit external coupling to flag 220, including, for example, ground connections and heat sink connections.

Figure 4:
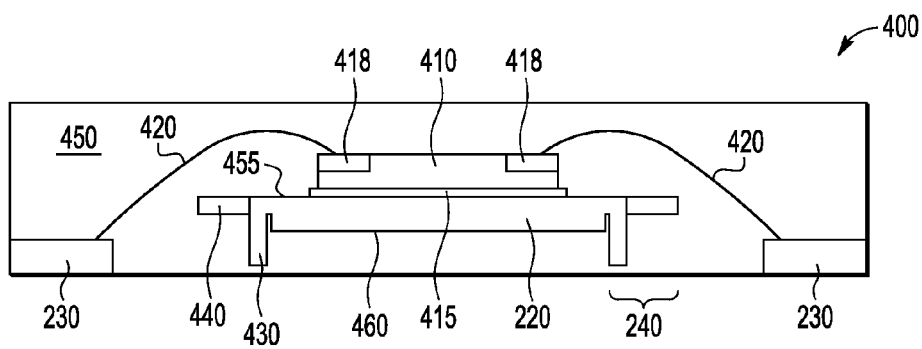
FIG. 4 is a simplified block diagram illustrating a cross-sectional side view of another packaged electronic device constructed in accord with an embodiment of the present invention.

FIG. 4 is a simplified block diagram illustrating a cross-sectional side view of an alternative packaged electronic device 400, in accord with an embodiment of the present invention. Packaged electronic device 400 includes lead frame 210, illustrated as flag 220 and leads 230. Packaged electronic device 400 also includes die 410 attached to a surface 455 of flag 220 by a layer of adhesive 415 (e.g., epoxy). Connection pads 418 on die 410 are connected to leads 230 by bonding wires 420. FIG. 4 illustrates flag edge features 240 in a configuration in which there are bent down edge features 430 and non-bent edge features 440. A molding compound 450 encapsulates all the structures of packaged electronic device 400, aside from exposed portions of leads 230. FIG. 4 is illustrative of a packaged electronic device in which it is desirable to not expose a surface of flag 220, thereby the flag remains encapsulated in molding compound 450, or in which it is desirable to mount a device (e.g., a die or other structure) on surface 460 of die 220.

Figure 5:
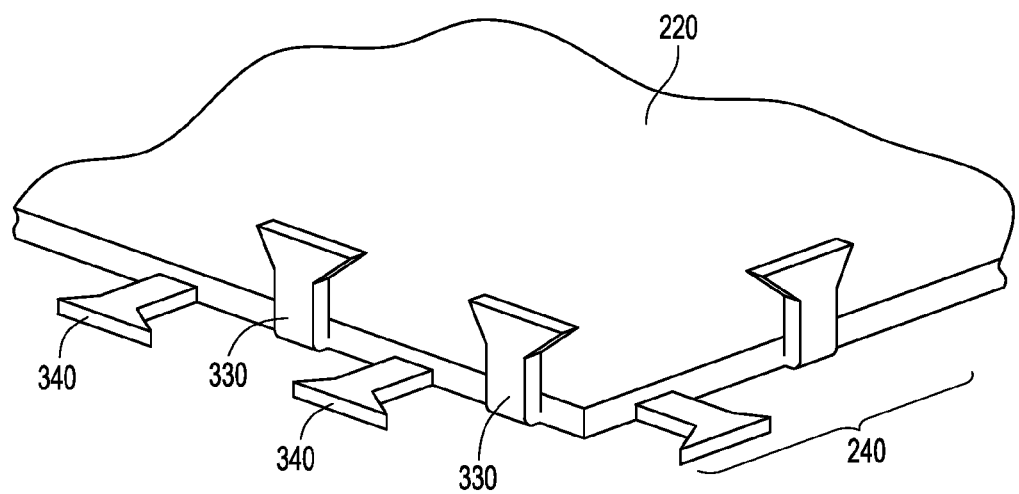
FIG. 5 is a simplified block diagram illustrating a perspective view of flag edge features of embodiments of the present invention.

FIG. 5 is a simplified block diagram illustrating a perspective view of flag edge features of embodiments of the present invention. A portion of flag 220 is illustrated showing examples of flag edge features 240. The example shown in FIG. 5 includes bent edge features 330 and non-bent edge features 340. Although the example shown in FIG. 5 illustrates alternating bent and non-bent edge features, it should be understood that embodiments of the present invention are not restricted to alternating features. It should also be understood that, while bent edge features 330 in both FIG. 3 and FIG. 5 are illustrated at a 90° angle to the plane of flag 220, a 90° angle is not required to implement embodiments of the present invention. For example, it may be advantageous to bend some or all of flag edge features 240 at a variety of angles to compensate for particular stress effects experienced in certain applications or certain locations of a flag in a packaged electronic device. In addition, angles intermediate between 0° and 90° will have a mold locking effect experienced in both the plane of flag 220 as well as a plane perpendicular to that of the plane of flag 220. Further, for the example of the packaged electronic device in FIG. 4, flag edge features can be bent to angles both positive and negative with respect to the plane of flag 220.

As discussed above, embodiments of the present invention are configured to compensate for separation effects between portions of a lead frame (e.g., a flag) and an encapsulating mold compound in a package electronic device. These separation effects are experienced not only in processing of the packaged semiconductor device but also in normal operating conditions of many packaged semiconductor devices. Some are found to be more stable within a particular operating range (e.g., 150° C. through −40° C.) but may experience greater separation effects than other mold compounds. Providing locking features of the present invention increases a manufacturer's options for the types of mold compounds usable for a package semiconductor device intended for particular application. Further, differing shapes of flag edge features may work better with certain types of mold compounds.

Figure 6:
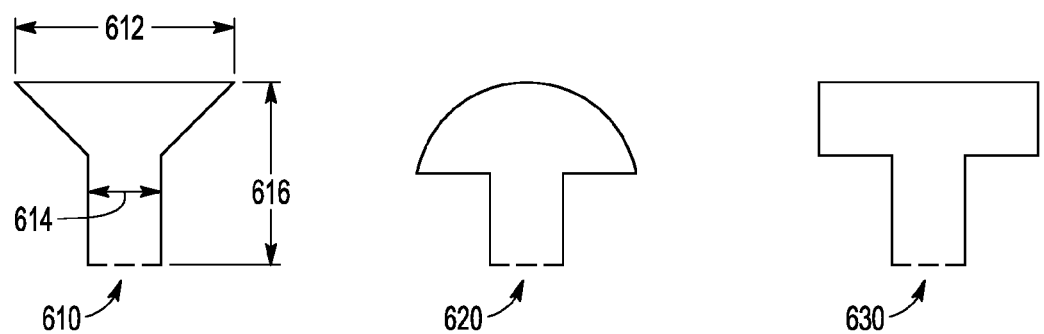
FIG. 6 is a simplified block diagram illustrating examples of shapes of flag edge features, in accord with embodiments of the present invention.

FIG. 6 is a simplified block diagram illustrating examples of shapes of flag edge features, in accord with embodiments of the present invention. For each of flag edge feature examples 610, 620 and 630, the "bottom" of the illustrated feature is the attachment point with a flag (e.g., flag 220). A common aspect of each feature example is that the free end of the flag edge feature is significantly wider than the width of the flag edge feature at the attachment point. This increase in width facilitates locking of the flag edge feature with the mold compound, thereby avoiding slipping of the flag edge feature in the mold compound and avoiding separation of the encapsulant mold compound from the flag. In one example 610, a maximum free end width near the free end (612) is approximately twice that of fixed end width (614). Such a relationship between the maximum width of the flag edge feature and the fixed end width is maintained in examples 620 and 630. Further, in some embodiments, the length 616 of a flag edge feature is approximately the same as the maximum width 612.

As illustrated in FIG. 6, shapes of the flag edge features are not limited to a particular shape, but should have a shape that facilitates locking with the mold compound. Manufacturing limitations as well as available area limitations may further dictate those shapes that can effectively be used. It should also be realized that embodiments of the present invention are not limited to having a single shape of the flag edge features on a single flag. For example, it may be found that one flag edge feature shape is more beneficial in the plane of the flag, while a different flag edge feature shape is more beneficial out of the plane of the flag.

By now it should be appreciated that one embodiment of the present invention provides a packaged electronic device that includes: a lead frame comprising a flag lying in a first plane defined by the body of the flag, where the flag includes a plurality of flag edge features located along the perimeter of the flag and at least one flag edge feature is bent near a connection with the flag such that a majority of the flag edge feature lies in a second plane other than the first plane; and a cured mold compound encapsulating at least a portion of the flag and the flag edge feature, where each flag edge feature has corresponding first and second ends, the first end of each flag feature is attached to the flag, and the second end of each flag feature is formed to resist movement of the mold compound in a direction of the plane of the flag edge feature where the mold compound comes in contact with the flag edge feature.

One aspect of the above embodiment provides for the second end of the flag edge feature to be formed to resist movement of the mold compound by virtue of being wider than the first end. In a further aspect, the second end of the flag edge feature is about twice as wide as the first edge.

In another aspect of the above embodiment, the flag further includes a second flag edge feature that lies in the plane of the flag. In another aspect of the above embodiment, the flag further includes a second flag edge feature that is bent near a connection with the flag such that a majority of the second flag edge feature lies in a third plane other than the first and second planes.

In still another aspect of the above embodiment, alternating flag edge features of the plurality of flag edge features are bent. In a further aspect, each of the bent flag edge features are bent from the first plane at a same angle. In still a further aspect, the angle is 90° from the first plane. In another further aspect, a first subset of the bent flag edge features are bent from the first plane at a first angle, a second subset of the bent flag edge features are bent from the first plane at a second angle, and the first and second angles are different.

In another aspect of the above embodiment, the lead frame further includes one or more leads arranged around the flag and a die, adhesively coupled to a major surface of the flag along a major surface of the die, having one or more connection pads where a connection pad is conductively coupled to a lead of the one or more leads.

In yet another aspect of the above embodiment, the flag has a first thickness and each flag edge feature has a second thickness, which is less than the first thickness. In a further aspect, the flag edge feature has a length from the first end to the second end that is greater than the first thickness. In still a further aspect, the length of the first flag edge feature is about twice the first thickness.

Another embodiment provides a lead frame for a packaged electronic device where the lead frame includes: a flag having a plurality of flag edge features located along a perimeter of the flag, wherein the flag lies in the plane defined by the body of the flag and a first flag edge feature is bent near a connection with the flag such that a majority of the first flag edge feature lies in a second plane other than the first plane; and leads arranged around the flag.

In one aspect of the above embodiment, the first flag edge feature includes a first end attached to the flag and a second end formed to resist movement of a cured mold compound in a direction along the second plane. In a further aspect, the second end of the first flag edge feature is formed to resist movement of the cured mold compound by virtue of being wider than the first end of the first flag edge feature. In still a further aspect, the second end of the first flag edge feature is approximately twice as wide as the first end of the first flag edge feature.

In another aspect of the above embodiment, the flag further includes a second flag edge feature that lies in the plane of the flag. In yet another aspect of the above embodiment, a second flag edge feature is bent near a connection with the flag such that the majority of the second flag edge feature lies in a third plane other than the first and second planes.

Another embodiment of the present invention provides for a method for forming a packaged electronic device that includes forming a lead frame for a packaged electronic device where the forming includes etching a metallic substrate and to form a lead frame flag that includes a flag body and flag edge features coupled to the flag body at a first end of each flag edge feature and one or more leads arranged around the lead frame flag, and selectively etching the flag edge features to a thickness less than half a thickness of the lead frame flag. The flag edge features are shaped to resist movement of an encapsulant mold compound by virtue of being wider at a second end of each flag edge feature than at the first end of the flag edge feature. The method further includes bending one or more of the flag edge features at an angle such that a majority of each of the bent flag edge features is in a plane other than that of the flag body, attaching a semiconductor device to the flag body, one or more electrical contacts of the semiconductor device to corresponding leads of the one or more leads arranged around the lead frame flag, and encapsulating the lead frame, semiconductor device, and couplings using the encapsulant mold compound.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged electronic device comprising:
   a lead frame comprising a flag lying in a first plane defined by a body of the flag, wherein
      the flag comprises a plurality of flag edge features located along a perimeter of the flag,
      a first flag edge feature is bent near a connection with the flag such that a majority of the first flag edge feature lies in a second plane other than the first plane, and
      a second flag edge feature is bent near a connection with the flag such that the majority of the second flag edge feature lies in a third plane other than the first and second planes; and
   a cured mold compound encapsulating at least a portion of the flag and the first flag edge feature, wherein
      each flag edge feature comprises corresponding first and second ends,
      the first end of each flag edge feature is attached to the flag, and
      the second end of each flag edge feature is formed to resist movement of the mold compound in a direction of the plane of the flag edge feature where the mold compound comes in contact with the flag edge feature.

2. The packaged electronic device of claim 1 wherein the second end of the first flag edge feature is formed to resist movement of the mold compound by virtue of being wider than the first end of the first flag edge feature.

3. The packaged electronic device of claim 2 wherein the second end of the first flag edge feature is approximately twice as wide as the first edge of the first flag edge feature.

4. The packaged electronic device of claim 1 wherein the lead frame further comprises:
   one or more leads arranged around the flag; and
   a die, adhesively coupled to a first major surface of the flag along a major surface of the die, and comprising one or more connection pads, wherein
      a connection pad of the one or more connection pads is conductively coupled to a lead of the one or more leads.

5. A packaged electronic device comprising:
   a lead frame comprising a flag lying in a first plane defined by a body of the flag, wherein
      the flag comprises a plurality of flag edge features located along a perimeter of the flag,
      a first flag edge feature is bent near a connection with the flag such that a majority of the first flag edge feature lies in a second plane other than the first plane, and
      alternating flag edge features of the plurality of flag edge features are bent; and
   a cured mold compound encapsulating at least a portion of the flag and the first flag edge feature, wherein
      each flag edge feature comprises corresponding first and second ends,
      the first end of each flag edge feature is attached to the flag, and
      the second end of each flag edge feature is formed to resist movement of the mold compound in a direction of the plane of the flag edge feature where the mold compound comes in contact with the flag edge feature.

6. The packaged electronic device of claim 5 wherein each of the bent flag edge features are bent from the first plane at a same angle.

7. The packaged electronic device of claim 6 wherein the same angle is 90 degrees from the first plane.

8. The packaged electronic device of claim 5, wherein
   a first subset of the bent flag edge features are bent from the first plane at a first angle,
   a second subset of the bent flag edge features are bent from the first plane at a second angle, and
   the first and second angles are different.

9. The packaged electronic device of claim 1, wherein
   the flag exhibits a first thickness, and
   each flag edge feature exhibits a second thickness, wherein the second thickness is less than the first thickness.

10. The packaged electronic device of claim 9, wherein the first flag edge feature exhibits a length from the first end to the second end that is greater than the first thickness.

11. The packaged electronic device of claim 10 wherein the length of the first flag edge feature is about twice the first thickness.

12. A lead frame for a packaged electronic device, the lead frame comprising:
   a flag comprising a plurality of flag edge features located along a perimeter of the flag, wherein
      the flag lies in a plane defined by a body of the flag, and
      a first flag edge feature of the plurality of flag edge features is bent near a connection with the flag such that a majority of the first flag edge feature lies in a second plane other than the first plane, and a second flag edge feature of the plurality of flag edge features lies in the plane of the flag; and leads arranged around the flag.

13. The lead frame of claim 12 wherein the first flag edge feature comprises:

a first end attached to the flag; and a second end formed to resist movement of a cured mold compound in a direction along the second plane.

14. The lead frame of claim 13 wherein the second end of the first flag edge feature is formed to resist movement of the cured mold compound by virtue of being wider than the first end of the first flag edge feature.

15. The lead frame of claim 14 wherein the second end of the first flag edge feature is approximately twice as wide as the first end of the first flag edge feature.

\* \* \* \* \*